United States Patent
Pan et al.

(10) Patent No.: US 9,735,092 B2
(45) Date of Patent: Aug. 15, 2017

(54) MANUFACTURING METHOD OF CHIP PACKAGE STRUCTURE

(71) Applicant: ChipMOS Technologies Inc., Hsinchu (TW)

(72) Inventors: Yu-Tang Pan, Hsinchu (TW); Shih-Wen Chou, Hsinchu (TW)

(73) Assignee: ChipMOS Technologies Inc., Hsinchu (TW)

( * ) Notice: Subject to any disclaimer, the term of this patent is extended or adjusted under 35 U.S.C. 154(b) by 0 days.

(21) Appl. No.: 15/186,558

(22) Filed: Jun. 20, 2016

(65) Prior Publication Data

US 2016/0293529 A1 Oct. 6, 2016

Related U.S. Application Data

(62) Division of application No. 14/490,683, filed on Sep. 19, 2014, now Pat. No. 9,437,529.

(30) Foreign Application Priority Data

Apr. 3, 2014 (TW) .............................. 103112581 A (51) Int. Cl.
*H01L 23/495* (2006.01)
*H01L 21/48* (2006.01)
(Continued)

(52) U.S. Cl.
CPC .... *H01L 23/49568* (2013.01); *H01L 21/4828* (2013.01); *H01L 21/4871* (2013.01);
(Continued)

(58) Field of Classification Search
CPC .......................... H01L 23/49568; H01L 21/56
See application file for complete search history.

(56) References Cited

U.S. PATENT DOCUMENTS

| 2003/0057534 A1 | 3/2003 | Ho et al. |
| 2011/0079811 A1* | 4/2011 | Lin ........................ H01L 33/642 |
| | | 257/98 |
| 2011/0198662 A1 | 8/2011 | Lin et al. |

FOREIGN PATENT DOCUMENTS

WO 2006071098 7/2006

OTHER PUBLICATIONS

"Office Action of China Counterpart Application", issued on Apr. 26, 2017, p. 1-p. 9.

* cited by examiner

*Primary Examiner* — Moazzam Hossain
*Assistant Examiner* — Farun Lu
(74) *Attorney, Agent, or Firm* — Jianq Chyun IP Office (57) ABSTRACT

A manufacturing method of a chip package structure includes following steps. A substrate including a first metal layer, a second metal layer, and an insulation layer located between the first and the second metal layers is provided. A first groove is formed in the first metal layer to form a chip pad and bonding pads. The bonding pads are respectively located in recesses of the chip pad. A second groove is formed in the second metal layer to form a heat-dissipation block and terminal pads. The terminal pads are respectively located in recesses of the heat-dissipation block. Conductive vias are formed to connect the corresponding terminal pads and electrically connect the bonding pads with the terminal pads. A chip is disposed on the chip pad and electrically connected to the bonding pads. An encapsulant covering the chip is formed.

7 Claims, 5 Drawing Sheets

(51) Int. Cl.
*H01L 21/56* (2006.01)
*H01L 23/498* (2006.01)
*H01L 23/31* (2006.01)
*H01L 23/373* (2006.01)
*H01L 23/00* (2006.01)

(52) U.S. Cl.
CPC .......... *H01L 21/4875* (2013.01); *H01L 21/56* (2013.01); *H01L 23/3114* (2013.01); *H01L 23/3736* (2013.01); *H01L 23/49503* (2013.01); *H01L 23/49524* (2013.01); *H01L 23/49541* (2013.01); *H01L 23/49861* (2013.01); *H01L 24/05* (2013.01); *H01L 24/11* (2013.01); *H01L 23/3107* (2013.01); *H01L 23/49586* (2013.01); *H01L 2224/04042* (2013.01); *H01L 2224/48091* (2013.01); *H01L 2224/73265* (2013.01); *H01L 2924/181* (2013.01)

MANUFACTURING METHOD OF CHIP PACKAGE STRUCTURE

CROSS-REFERENCE TO RELATED APPLICATION

This is a divisional application of and claims the priority benefit of U.S. patent application Ser. No. 14/490,683, filed on Sep. 19, 2014, now pending, which claims the priority benefit of Taiwan application serial no. 103112581, filed on Apr. 3, 2014. The entirety of each of the above-mentioned patent applications is hereby incorporated by reference herein and made a part of this specification.

BACKGROUND OF THE INVENTION

Field of the Invention

The invention relates to a semiconductor package structure and a manufacturing method thereof; more particularly, the invention relates to a chip package structure and a manufacturing method thereof.

Description of Related Art

In regard to the wire bonding technology, a lead-frame based design is mostly applied to the low pin-count IC packages. After going through the processes of wafer sawing, die bonding, wire bonding, molding, and trimming/forming, a conventional lead-frame based chip package is substantially completed.

To comply with the trend of lightness, slimness, shortness, and compactness of modern electronic devices, the sizes of chips also tend toward miniaturization accordingly. As the chip size is reduced, the distance between the chip and the inner leads of the lead frame is increased, and the lengths of the bonding wires for electrically connecting the chip to the inner leads of the lead frame have to be lengthened. However, when the lengths and the loop angles of the bonding wires are increased, the bonding wires are likely to collapse causing short circuit, and likely to be broken by the molding compound during molding injection process resulting in open circuit, both of which would reduce the yield rate of the chip packages. Besides, re-fabrication of the molds for producing the lead frames adapted to miniaturized chips would increase the overall production cost.

Furthermore, with the increasing integration density, chips become more and more complicated and multi-functional, and thus heat generated during the operation of the chips keeps increasing. Generally, the heat generated by the chip being dissipated directly through the chip pad has the best heat dissipation effect. Nevertheless, the chip pad and the leads of the conventional lead frame need be completely electrically insulated, and thus the chip pad and the leads should be separated by certain spacing, which poses a limitation to the size of the chip pad. Thus, the heat dissipation area of the chip pad cannot be effectively expanded so that the heat generated by the chip cannot be effectively dissipated, and the heat dissipation efficiency of the chip package structure is reduced.

SUMMARY OF THE INVENTION

The invention is directed to a chip package structure and a manufacturing method thereof, which are able to reduce the distance of wire bonding and enhance the heat dissipation efficiency.

In an embodiment, a chip package structure that includes a lead frame, a chip, and an encapsulant is provided. The lead frame includes a first patterned metal layer, a second patterned metal layer, and an insulation layer. The first patterned metal layer includes a chip pad and a plurality of bonding pads. The chip pad includes a plurality of first recesses. The first recesses are located at a periphery of the chip pad. The bonding pads are respectively located in the first recesses, and a first groove exists between each of the bonding pads and the chip pad. The second patterned metal layer is connected to the first patterned metal layer and includes a plurality of terminal pads and a heat dissipation block. The heat dissipation block is thermally coupled to the chip pad and includes a plurality of second recesses. The second recesses are located at a periphery of the heat dissipation block. The terminal pads are respectively located in the second recesses and electrically connected to the corresponding bonding pads. A second groove exists between each of the terminal pads and the heat dissipation block. The insulation layer is located between the bonding pads and the terminal pads. The chip is disposed on the chip pad and electrically connected to the bonding pads. The encapsulant covers the first patterned metal layer and the chip.

In an embodiment of the invention, a manufacturing method of a chip package structure includes following steps. A substrate is provided. The substrate includes a first metal layer, a second metal layer, and an insulation layer located between the first metal layer and the second metal layer. A first groove is formed in the first metal layer to form a first patterned metal layer. The first patterned metal layer includes a chip pad and a plurality of bonding pads, and the first groove exists between each of the bonding pads and the chip pad. The chip pad includes a plurality of first recesses located at a periphery of the chip pad. The bonding pads are respectively located in the first recesses. A second groove is formed in the second metal layer to form a second patterned metal layer. The second patterned metal layer includes a heat dissipation block and a plurality of terminal pads, and the second groove exists between each of the terminal pads and the heat dissipation block. The heat dissipation block includes a plurality of second recesses located at a periphery of the heat dissipation block. The terminal pads are respectively located in the second recesses, and the heat dissipation block is thermally coupled to the chip pad. Plural conductive vias are formed. The conductive vias respectively penetrate the bonding pads and the insulation layer and are connected to the corresponding terminal pads so as to electrically connect the bonding pads with the terminal pads. A chip is disposed on the chip pad and electrically connected to the bonding pads. An encapsulant is formed. The encapsulant covers the first patterned metal layer and the chip.

In view of the above, the chip package structure in the invention is formed by forming the first groove in the first metal layer of the substrate to separate the chip pad from the bonding pads, and forming the second groove in the second metal layer of the substrate to separate the heat dissipation block from the terminal pads. Thus, the bonding pads can extend near to the periphery of the chip according to product requirements, so as to reduce the distance of wire bonding. Thereby, the material cost can be reduced, and the yield of the wire bonding process and the subsequent processes can be improved. Besides, the dimensions of the terminal pads need not be equal to the dimensions of the corresponding bonding pads and may be properly reduced according to actual product requirements so that the dimensions of the heat dissipation block can be enlarged and the resultant heat dissipation area of the heat dissipation block is increased.

In addition, since the chip pad formed according to the manufacturing method described herein extends between the adjacent bonding pads, and the heat dissipation block extends between the adjacent terminal pads, not only the heat dissipation area is increased, but also the distance between the heat dissipation region and the electrical connection region is shortened so that the thermal impedance of the chip package structure is reduced. Moreover, since the first patterned metal layer and the second patterned metal layer described herein are insulated from each other by the insulation layer, during the molding process, the encapsulant is unable to overflow onto the bottom surface of the second patterned metal layer through the first groove and the second groove, so that it is not necessary to adhere a tape to the bottom surface of the second patterned metal layer during the molding process. As a result, the production cost is reduced and the packaging process is simplified.

Several exemplary embodiments accompanied with figures are described in detail below to further describe the invention in details.

DETAILED DESCRIPTION OF DISCLOSED EMBODIMENTS

Figure 1A:
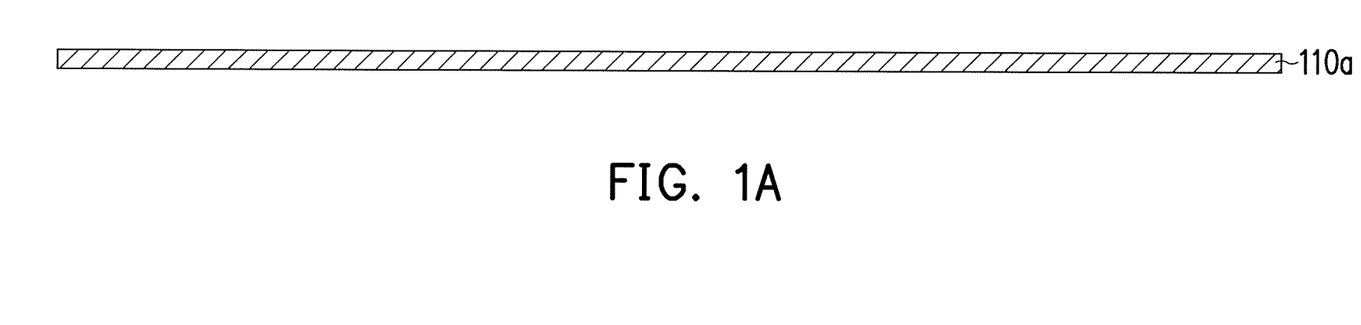
FIG. 1A to FIG. 1F are schematic cross-sectional views illustrating a manufacturing method of a chip package structure according to an embodiment of the invention.
Figure 1B:
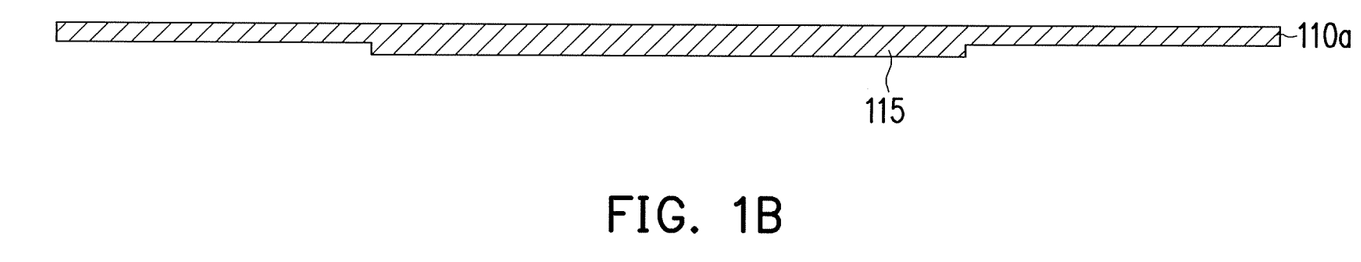
Figure 1C:
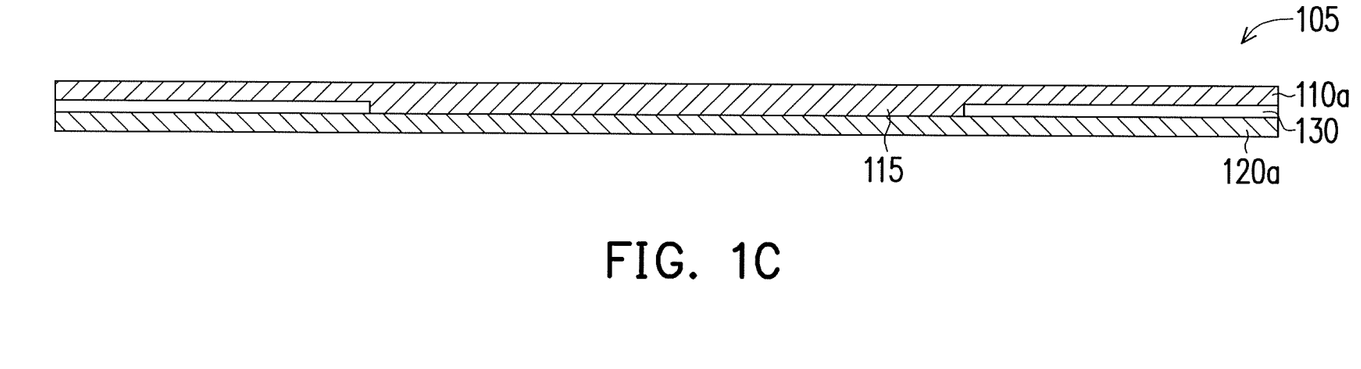

FIG. 1A to FIG. 1F are schematic cross-sectional views illustrating a manufacturing method of a chip package structure according to an embodiment of the invention. According to the present embodiment, the manufacturing method of the chip package structure includes following steps. A substrate 105 shown in FIG. 1C is provided. The substrate 105 includes a first metal layer 110a, a second metal layer 120a, and an insulation layer 130 located between the first metal layer 110a and the second metal layer 120a. To be specific, as shown in FIG. 1A to FIG. 1C, formation of the substrate 105 includes the following steps. The first metal layer 110a is provided first as shown in FIG. 1A, a connection bump 115 is formed on the first metal layer 110a as shown in FIG. 1B, and the insulation layer 130 is formed on the first metal layer 110a or on the second metal layer 120a as shown in FIG. 1C. In the present embodiment, the insulation layer 130 may be formed by coating or adherence, for instance. The first metal layer 110a and the second metal layer 120a are then laminated, as shown in FIG. 1C, such that the first metal layer 110a can be thermally coupled to the second metal layer 120a through the connection bump 115, and that the insulation layer 130 is distributed between the first metal layer 110a and the second metal layer 120a and surrounds the connection bump 115.

Certainly, in another embodiment of the invention, the connection bump 115 may be formed on the second metal layer 120a, the insulation layer 130 is formed, and then the first metal layer 110a and the second metal layer 120a are laminated to form the substrate 105. The formation of the substrate 105 is not limited to those described herein. As long as the connection bump 115 is located between the first metal layer 110a and the second metal layer 120a to thermally couple the first metal layer 110a to the second metal layer 120a, and the insulation layer 130 surrounds the connection bump 115 and is distributed between the first metal layer 110a and the second metal layer 120a, the formation of the substrate 105 does not depart from the scope of protection provided in the invention.

Figure 1D:
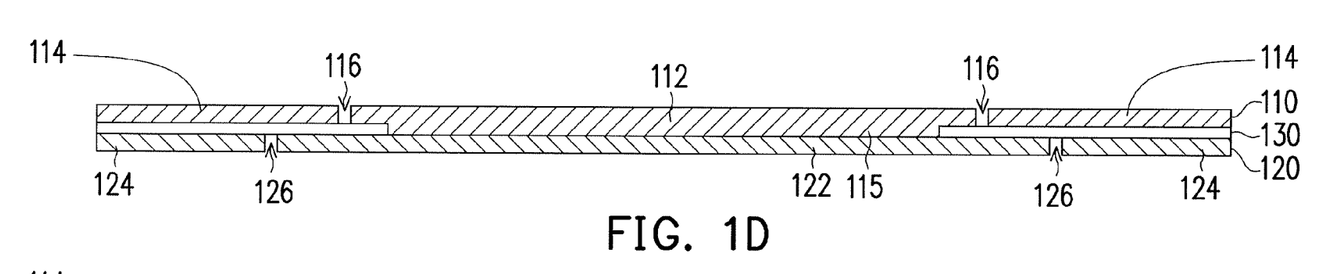
Figure 2:
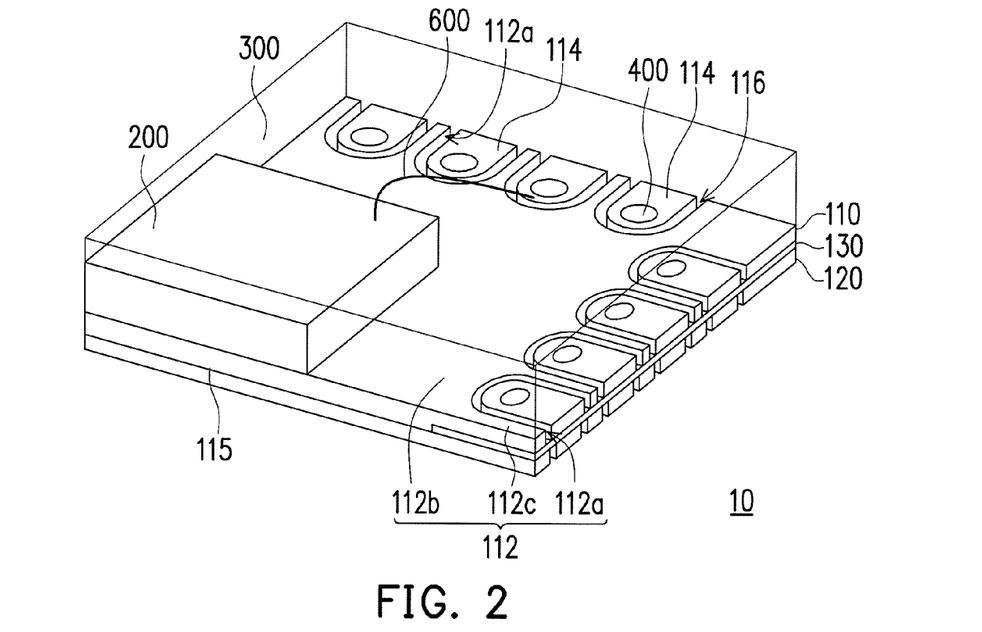
FIG. 2 is a schematic three-dimensional view illustrating a chip package structure according to an embodiment of the invention.

FIG. 2 is a schematic three-dimensional view illustrating a chip package structure according to an embodiment of the invention. Referring to FIG. 1D and FIG. 2, a first groove 116 is formed in the first metal layer 110a so as to form a first patterned metal layer 110 shown in FIG. 1D and FIG. 2. The first patterned metal layer 110 includes a chip pad 112 and a plurality of bonding pads 114, and the first groove 116 exists between each of the bonding pads 114 and the chip pad 112. That is, the first patterned metal layer 110 is separated into the chip pad 112 and the bonding pads 114 by the first groove 116. The chip pad 112 as shown in FIG. 2 includes a plurality of first recesses 112a. The first recesses 112a are located at a periphery of the chip pad 112, and the bonding pads 114 are respectively located in the first recesses 112a.

In particular, the chip pad 112 shown in FIG. 2 includes a first main body 112b and a plurality of first extensions 112c. The first main body 112b serves to carry a chip (e.g., the chip 200 shown in FIG. 1F), and the first extensions 112c extend in a direction away from the first main body 112b and collectively define the first recesses 112a with the first main body 112b. As shown in FIG. 2, each of the first extensions 112c respectively extends between every two adjacent bonding pads 114, and at least one edge of each of the first extensions 112c is aligned to at least one edge of the adjacent bonding pads 114.

Figure 3:
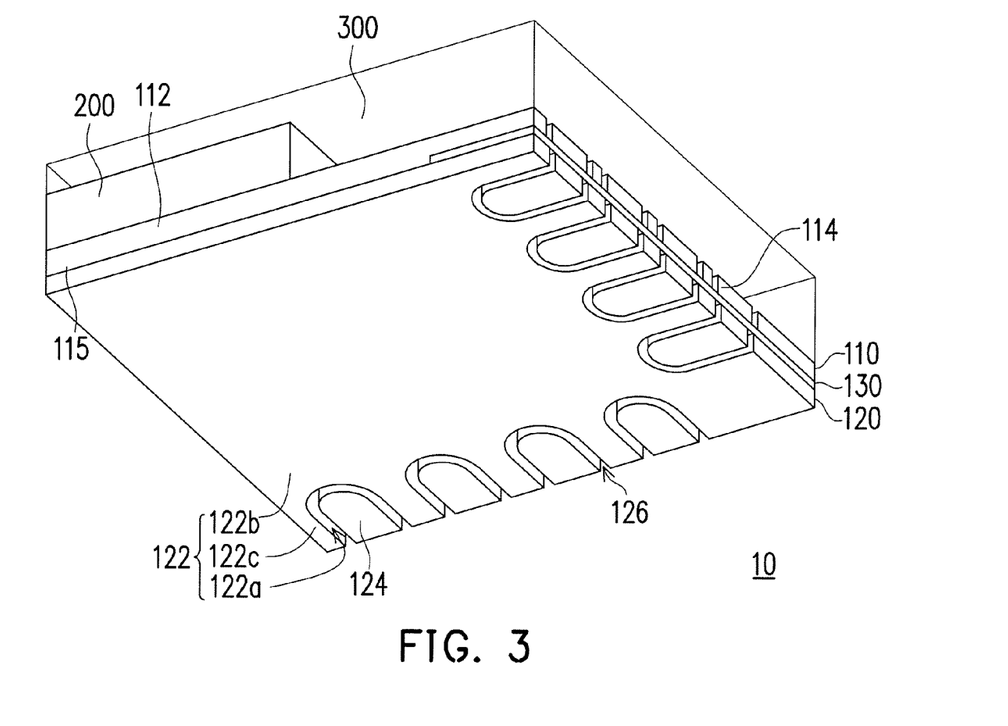
FIG. 3 is a schematic three-dimensional view illustrating the chip package structure depicted in FIG. 2 from another angle.

FIG. 3 is a schematic three-dimensional view illustrating the chip package structure depicted in FIG. 2 from another angle. Referring to FIG. 1D and FIG. 2, similarly, a second groove 126 is formed in the second metal layer 120a so as to form a second patterned metal layer 120 as shown in FIG. 1D and FIG. 3. The second patterned metal layer 120 includes a heat dissipation block 122 and a plurality of terminal pads 124, and the second groove 126 exists between each of the terminal pads 124 and the heat dissipation block 122. That is, the second patterned metal layer 120 is separated into the heat dissipation block 122 and the terminal pads 124 by the second groove 126. The heat dissipation block 122 shown in FIG. 3 includes a plurality of second recesses 122a. The second recesses 122a are located at a periphery of the heat dissipation block 122, and the terminal pads 124 are respectively located in the second recesses 122a. The heat dissipation block 122 may be arranged corresponding to the chip pad 112 in position, and the connection bump 115 is located between the chip pad 112 and the heat dissipation block 122, as shown in FIG. 1C, so as to thermally couple the chip pad 112 to the heat dissipation block 122. The insulation layer 130 surrounds the connection bump 115 and is distributed between the bonding pads 114 and the terminal pads 124. According to the present embodiment of the invention, a size of the heat dissipation block 122 is not smaller than a size of the chip pad 112. Preferably, the size of the heat dissipation block 122 is larger than the size of the chip pad 112 in order to enhance the heat dissipation efficiency.

In particular, the heat dissipation block 122 as shown in FIG. 3 includes a second main body 122b and a plurality of second extensions 122c. The second extensions 122c extend in a direction away from the second main body 122b and collectively define the second recesses 122a with the second main body 122b. As shown in FIG. 3, each of the second extensions 122c respectively extends between every two adjacent terminal pads 124, and at least one edge of each of the second extensions 122c is aligned to at least one edge of the adjacent terminal pads 124.

Figure 1E:
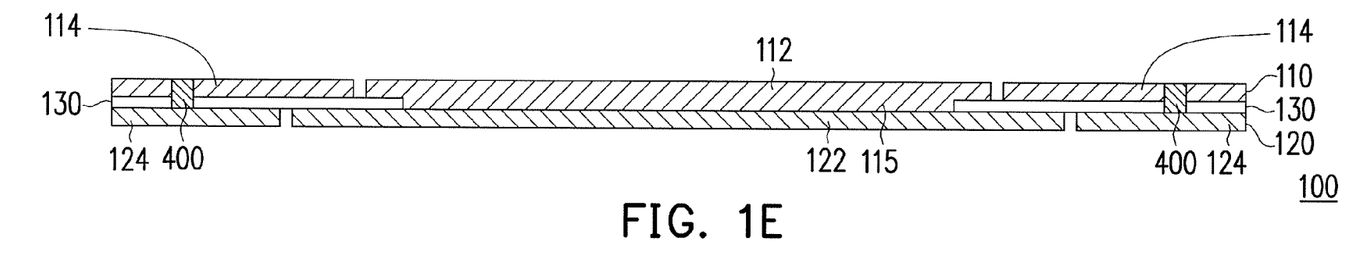

Plural conductive vias 400 as shown in FIG. 1E are formed. The conductive vias 400 respectively penetrate the bonding pads 114 and the insulation layer 130 and are connected to the corresponding terminal pads 124 so as to electrically connect the bonding pads 114 with the terminal pads 124. In the present embodiment, the conductive vias 400 may be formed by first forming holes respectively penetrating the bonding pads 114 and the insulation layer 130 until the terminal pads 124 are exposed, and then forming the conductive material in the holes by filling in solder materials or by electroplating. To this point, the lead frame 100 in the chip package structure of the present embodiment is substantially fabricated.

Figure 1F:
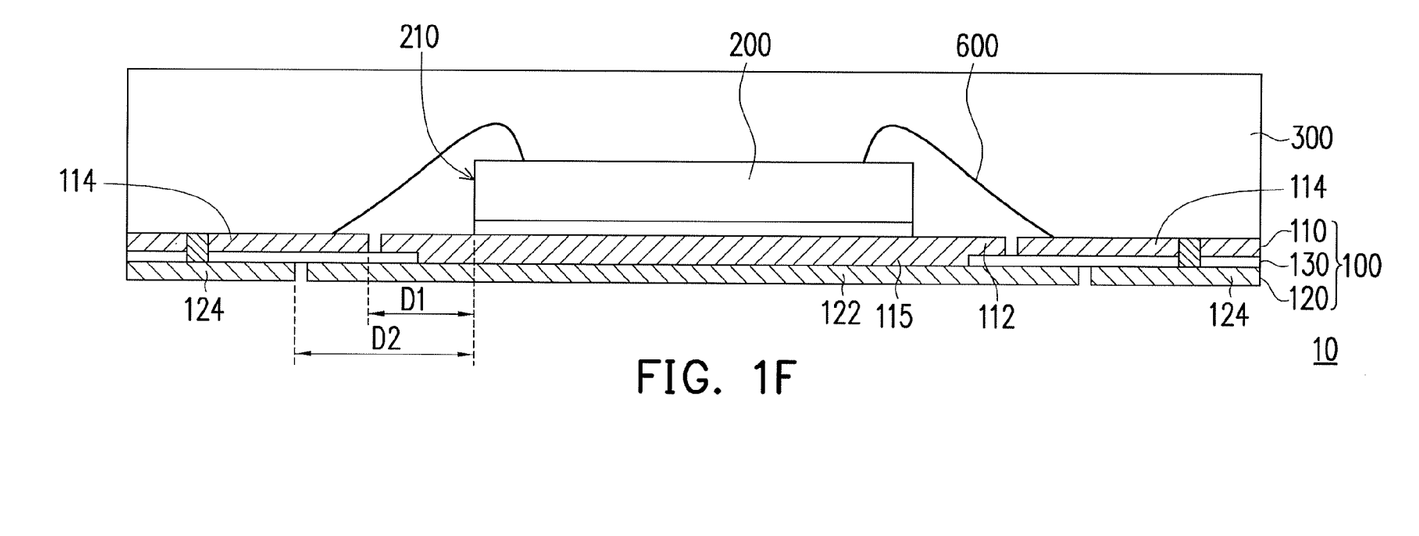

With reference to FIG. 1F and FIG. 2, a chip 200 is disposed on the chip pad 112 and is electrically connected to the bonding pads 114. Specifically, the chip 200 is disposed on the first main body 112b of the chip pad 112, and the chip 200 and the bonding pads 114 may be electrically connected by a plurality of bonding wires 600 as shown in FIG. 1F. Note that only one of the bonding wires 600 is shown in FIG. 2 for clear illustration. The number of the bonding wires 600 and the number of the bonding pads 114 are not limited herein. An encapsulant 300 is then formed, which covers the first patterned metal layer 110, the bonding wires 600 and the chip 200, and can further fill in the first groove 116. So far, the chip package structure 10 described in the present embodiment is substantially formed.

As shown in FIG. 1F, the chip package structure 10 that is formed according to the aforesaid manufacturing method includes the lead frame 100, the chip 200, and the encapsulant 300. The lead frame 100 includes a first patterned metal layer 110, a second patterned metal layer 120, and an insulation layer 130. The first patterned metal layer 110 includes a chip pad 112 and a plurality of bonding pads 114. The chip pad 112 includes a plurality of first recesses 112a located at a periphery of the chip pad 112. The bonding pads 114 are respectively located in the first recesses 112a, and a first groove 116 exists between each of the bonding pads 114 and the chip pad 112. The second patterned metal layer 120 includes a heat dissipation block 122 and a plurality of terminal pads 124. The heat dissipation block 122 includes a plurality of second recesses 122a located at a periphery of the heat dissipation block 122. The terminal pads 124 are respectively located in the second recesses 122a and electrically connected to the corresponding bonding pads 114. A second groove 126 exists between each of the terminal pads 124 and the heat dissipation block 122. In the present embodiment, the connection bump 115 is located between the first patterned metal layer 110 and the second patterned metal layer 120 and connects the chip pad 112 and the heat dissipation block 122, so as to thermally couple the chip pad 112 to the heat dissipation block 122. The insulation layer 130 surrounds the connection bump 115 and is distributed between the bonding pads 114 and the terminal pads 124. The chip 200 is disposed on the chip pad 112 and electrically connected to the bonding pads 114 through the bonding wires 600, for instance. The encapsulant 300 covers the first patterned metal layer 110 and the chip 200, and can further fill in the first groove 116. According to the present embodiment, the size of the heat dissipation block 122 is larger than the size of the chip pad 112, as shown in FIG. 1F, so as to enhance the heat dissipation efficiency. Thereby, a minimum horizontal distance D1 from each of the bonding pads 114 to one side 210 of the chip 200 is smaller than a minimum horizontal distance D2 from each of the corresponding terminal pads 124 to an orthogonal projection of the side 210 of the chip 200 on the heat dissipation block 122.

In light of the above, in the chip package structure 10 of the present embodiment, the chip pad 112 and the bonding pads 114 are defined by forming the first groove 116 in the first metal layer 110a of the substrate 105, and the heat dissipation block 122 and the terminal pads 124 are defined by forming the second groove 126 in the second metal layer 120a of the substrate 105. Thus, the bonding pads 114 can extend near to the periphery of the chip 200 according to product requirements, so as to reduce the lengths of the bonding wires 600 connecting the chip 200 and the bonding pads 114, i.e., reduce the distance of wire bonding. Thereby, the material cost can be reduced, and the yield of the wire bonding process and the subsequent processes can be improved. Besides, the dimensions of the terminal pads 124 need not be equal to the dimensions of the corresponding bonding pads 114 as long as the terminal pads 124 can be connected to the conductive vias 400 that penetrate the corresponding bonding pads 114 and the insulation layer 130. Hence, the dimensions of the terminal pads 124 may be properly reduced according to actual product requirements so that the dimensions of the heat dissipation block 122 can be enlarged and the resultant heat dissipation area of the heat dissipation block 122 is increased. In addition, since the chip pad 112 formed according to the manufacturing method described herein extends between the adjacent bonding pads 114, and the heat dissipation block 122 extends between the adjacent terminal pads 124, not only the heat dissipation area is increased, but also the distance between the heat dissipation region and the electrical connection region is shortened so that the thermal impedance of the chip package structure is reduced. Moreover, since the first patterned metal layer 110 and the second patterned metal layer 120 described herein are insulated from each other by the insulation layer 130, during the molding process, the encapsulant 300 is unable to overflow onto the bottom surface of the second patterned metal layer 120 through the first groove 116 and the second groove 126, so that it is not necessary to adhere a tape to the bottom surface of the second patterned metal layer 120 during the molding process. As a result, the production cost is reduced, and the packaging process is simplified.

FIG. 4A to FIG. 4D are schematic cross-sectional views illustrating a manufacturing method of a chip package structure according to another embodiment of the invention. It should be mentioned that the manufacturing method of the chip package structure described in the present embodiment is similar to that provided in the previous embodiment, and therefore reference numbers and some descriptions provided in the previous exemplary embodiment are also applied in the following exemplary embodiment. The same reference numbers represent the same or similar components in these exemplary embodiments, and repetitive descriptions are omitted. The descriptions similar to the omitted parts may be found in the previous embodiments and will not be again provided hereinafter.

Figure 4A:
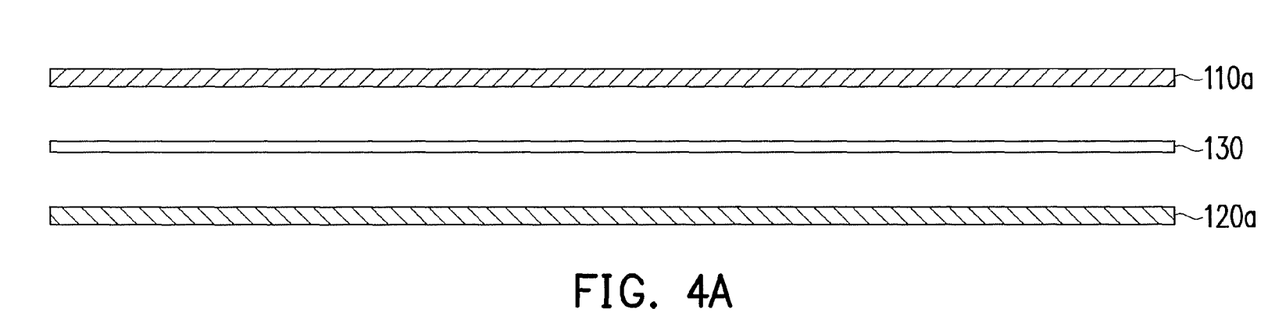
FIG. 4A to FIG. 4D are schematic cross-sectional views illustrating a manufacturing method of a chip package structure according to another embodiment of the invention.
Figure 4B:
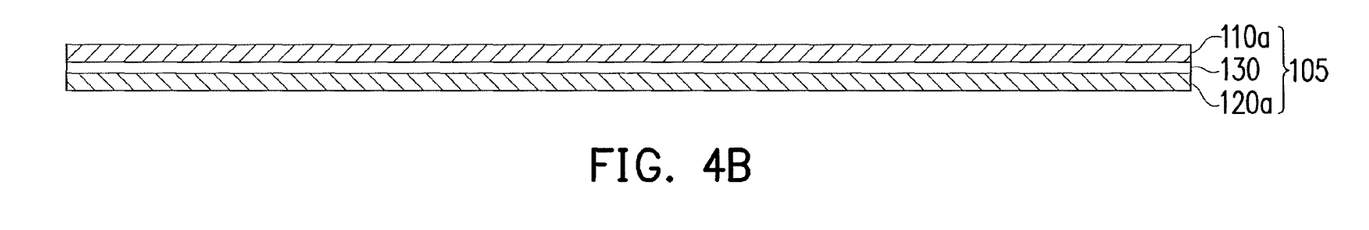

According to the present embodiment, the manufacturing method of the chip package structure includes following steps. Referring to FIG. 4A and FIG. 4B, the first metal layer 110a, the insulation layer 130, and the second metal layer 120a are laminated to form the substrate 105 as shown in FIG. 4B. Particularly, in the present embodiment, the insulation layer 130 may first be formed on the second metal layer 120a by coating or adherence, for instance, and the first metal layer 110a is then laminated to the insulation layer 130 and the second metal layer 120a. In another embodiment of the invention, the insulation layer 130 may be formed on the first metal layer 110a, and the second metal layer 120a is then laminated to the insulation layer 130 and the first metal layer 110a. The formation of the substrate 105 is not limited in the invention. As long as the first metal layer 110a, the insulation layer 130, and the second metal layer 120a are laminated to form the substrate 105, the formation of the substrate 105 does not depart from the scope of protection provided in the invention.

Figure 4C:
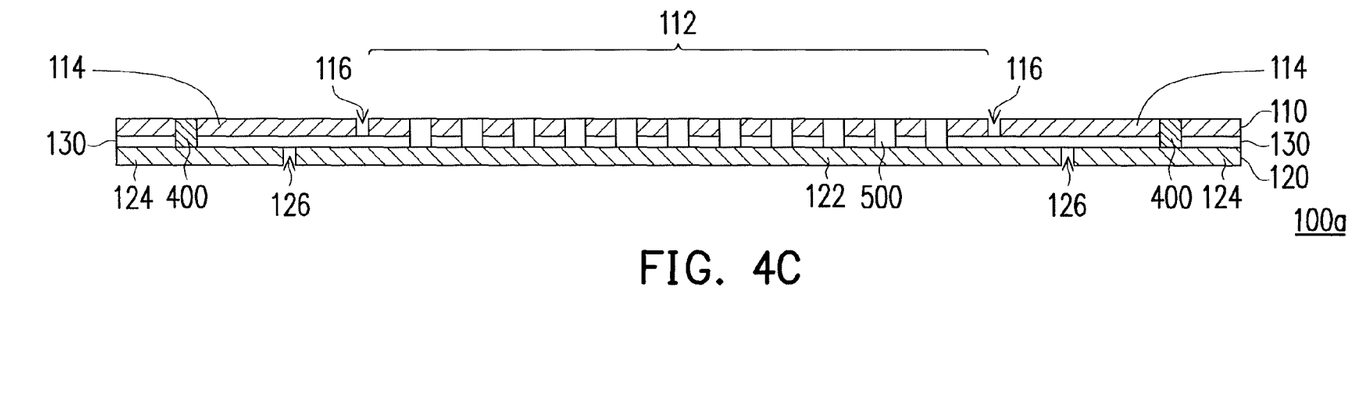

The first groove 116 is formed in the first metal layer 110a shown in FIG. 4B to form the first patterned metal layer 110 shown in FIG. 4C. In the present embodiment, the first groove 116 is formed at the location similar to that shown in FIG. 2 to separate the first metal layer 110a into a chip pad 112 and a plurality of bonding pads 114; that is, the first patterned metal layer 110 includes the chip pad 112 and the bonding pads 114, and the first groove 116 exists between each bonding pad 114 and the chip pad 112. The chip pad 112 may include a plurality of first recesses 112a, as shown in FIG. 2. The first recesses 112a are located at a periphery of the chip pad 112, and the bonding pads 114 are respectively located in the first recesses 112a.

The second groove 126 is formed in the second metal layer 120a shown in FIG. 4B to form the second patterned metal layer 120 shown in FIG. 4C. In the present embodiment, the second groove 126 is formed at the location similar to that shown in FIG. 3 to separate the second metal layer 120a into a heat dissipation block 122 and a plurality of terminal pads 124; that is, the second patterned metal layer 120 includes the heat dissipation block 122 and the terminal pads 124, and the second groove 126 exists between each terminal pad 124 and the heat dissipation block 122. The heat dissipation block 122 includes a plurality of second recesses 122a, as shown in FIG. 3. The second recesses 122a are located at a periphery of the heat dissipation block 122, and the terminal pads 124 are respectively located in the second recesses 122a. The heat dissipation block 122 may be arranged corresponding to the chip pad 112 in position, as shown in FIG. 4C, and the size of the heat dissipation block 122 is not smaller than the size of the chip pad 112. Preferably, the size of the heat dissipation block 122 is larger than the size of the chip pad 112 so as to expand the heat dissipation area. The insulation layer 130 is distributed between the chip pad 112 and the heat dissipation block 122 and between the bonding pads 114 and the terminal pads 124; namely, the insulation layer 130 is evenly distributed between the first patterned metal layer 110 and the second patterned metal layer 120.

Plural conductive vias 400 are formed as shown in FIG. 4C. The conductive vias 400 respectively penetrate the bonding pads 114 and the insulation layer 130 and are connected to the corresponding terminal pads 124 so as to electrically connect the bonding pads 114 with the terminal pads 124. Here, the method of forming the conductive vias 400 is as described for that shown in FIG. 1E above. Besides, in the present embodiment, plural thermal vias 500 may be further formed, where the thermal vias 500 penetrate the chip pad 112 and the insulation layer 130 and are connected to the heat dissipation block 122, as shown in FIG. 4C, so as to thermally couple the chip pad 112 to the heat dissipation block 122. That is, the difference between the present embodiment and the previous embodiment lies in the omission of forming the connection bump 115 shown in FIG. 1B on the first metal layer 110a or the second metal layer 120a, but instead forming the thermal vias 500 penetrating the chip pad 112 and the insulation layer 130 to thermally couple the chip pad 112 to the heat dissipation block 122. To this point, the lead frame 100a in the chip package structure of the present embodiment is substantially fabricated.

Figure 4D:
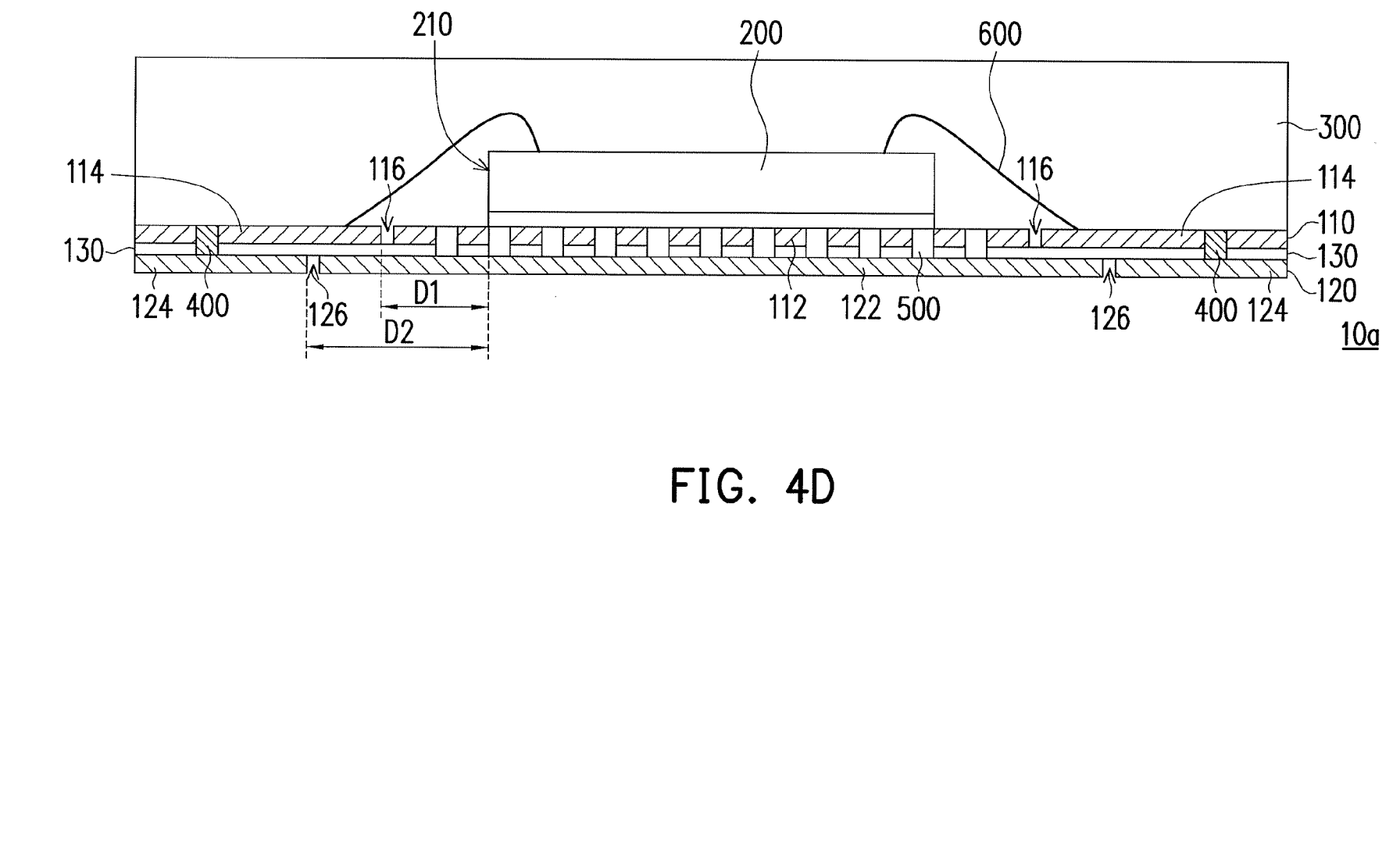

Referring to FIG. 4D, the chip 200 is disposed on the chip pad 112 and is electrically connected to the bonding pads 114. In the present embodiment, the chip 200 is electrically connected to the bonding pads 114 through a plurality of bonding wires 600, for instance. The encapsulant 300 is then formed, which covers the first patterned metal layer 110, the bonding wires 600 and the chip 200, and can further fill in the first groove 116. So far, the chip package structure 10a described in the present embodiment is substantially formed.

Structurally, the chip package structure 10a and the chip package structure 10 shown in FIG. 1F are similar, whereas the chip package structure 10a described in the present embodiment does not include the connection bump 115 connecting the first patterned metal layer 110 and the second patterned metal layer 120 as shown in FIG. 1B, and the insulation layer 130 in the chip package structure 10a is distributed evenly between the first patterned metal layer 110 and the second patterned metal layer 120. In addition, the chip package structure 10a further includes the thermal vias 500 which penetrate the chip pad 112 and the insulation layer 130 and are connected to the heat dissipation block 122, so as to thermally couple the chip pad 112 to the heat dissipation block 122. Namely, the difference between the chip package structure 10a described herein and the chip package structure 10 shown in FIG. 1F lies in that the present embodiment uses the thermal vias 500 penetrating the chip pad 112 and the insulation layer 130 to thermally couple the chip pad 112 to the heat dissipation block 122, but the chip package structure 10 uses the connection bump 115 connecting the chip pad 112 and the heat dissipation block 122 to thermally couple the chip pad 112 to the heat dissipation block 122. Moreover, in the present embodiment, the dimensions of the heat dissipation block 122 is larger than the dimensions of the chip pad 112, as shown in FIG. 4D, so as to enhance the heat dissipation efficiency. Thereby, the minimum horizontal distance D1 from each of the bonding pads 114 to one side 210 of the chip 200 is smaller than the minimum horizontal distance D2 from each of the corresponding terminal pads 124 to the orthogonal projection of the side 210 of the chip 200 on the heat dissipation block 122.

To sum up, the lead frame of the chip package structure in the invention is formed by patterning the first metal layer of the substrate to form in the first groove that separates the chip pad from the bonding pads, and patterning the second metal layer of the substrate to form the second groove that separates the heat dissipation block from the terminal pads. Thus, the bonding pads can extend near to the periphery of the chip according to product requirements, so as to reduce the distance of wire bonding. Thereby, the material cost can be reduced, and the yield of the wire bonding process and the subsequent processes can be improved. Besides, the dimensions of the terminal pads need not be equal to the dimensions of the corresponding bonding pads as long as the terminal pads can be connected to the conductive vias that penetrate the corresponding bonding pads and the insulation layer. Hence, the dimensions of the terminal pads may be properly reduced according to actual product requirements so that the dimensions of the heat dissipation block can be enlarged and the resultant heat dissipation area of the heat dissipation block is increased. In addition, since the chip pad formed according to the manufacturing method described herein extends between the adjacent bonding pads, and the heat dissipation block extends between the adjacent terminal pads, not only the heat dissipation area is increased, but also the distance between the heat dissipation region and the electrical connection region is shortened so that the thermal impedance of the chip package structure is reduced. Moreover, the invention can use the connection bump connecting the chip pad and the heat dissipation block or the thermal vias penetrating the chip pad and the insulation layer and being connected to the heat dissipation block to form thermal coupling between, the chip pad and the heat dissipation block, so as to enhance the heat dissipation effects of the chip package structure.

Moreover, since the first patterned metal layer and the second patterned metal layer described herein are insulated from each other by the insulation layer, during the molding process, the encapsulant is unable to overflow onto the bottom surface of the second patterned metal layer through the first groove and the second groove, so that it is not necessary to adhere a tape to the bottom surface of the second patterned metal layer during the molding process. As a result, the production cost is reduced, and the packaging process is simplified.

Although the invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. A manufacturing method of a chip package structure, comprising:
   providing a substrate, the substrate comprising a first metal layer, a second metal layer, and an insulation layer located between the first metal layer and the second metal layer;
   forming a first groove in the first metal layer to form a first patterned metal layer, wherein the first patterned metal layer comprises a chip pad and a plurality of bonding pads, the first groove exists between each of the bonding pads and the chip pad, the chip pad comprises a first main body, a plurality of first extensions and a plurality of first recesses located at a periphery of the chip pad, and the bonding pads are respectively located in the first recesses, the first extensions extend in a direction away from the first main body, such that the first extensions and the first main body collectively define the first recesses, each of the first extensions respectively extends between every two adjacent bonding pads, and at least one edge of each of the first extensions is aligned to at least one edge of the adjacent bonding pads;
   forming a second groove in the second metal layer to form a second patterned metal layer, wherein the second patterned metal layer comprises a heat dissipation block and a plurality of terminal pads, the second groove exists between each of the terminal pads and the heat dissipation block, the heat dissipation block comprises a plurality of second recesses located at a periphery of the heat dissipation block, the terminal pads are respectively located in the second recesses, and the heat dissipation block is thermally coupled to the chip pad;
   forming a plurality of conductive vias, the conductive vias respectively penetrating the bonding pads and the insulation layer and being connected to the corresponding terminal pads so as to electrically connect the bonding pads with the terminal pads;
   disposing a chip on the first main body of the chip pad and electrically connecting the chip to the bonding pads; and
   forming an encapsulant, the encapsulant covering the first patterned metal layer and the chip.

2. The manufacturing method as recited in claim 1, wherein the heat dissipation block comprises a second main body and a plurality of second extensions, the second extensions extend in a direction away from the second main body, such that the second extensions and the second main body collectively define the second recesses, each of the second extensions respectively extends between every two adjacent terminal pads, and at least one edge of each of the second extensions is aligned to at least one edge of the adjacent terminal pads.

3. The manufacturing method as recited in claim 1, wherein the step of providing the substrate comprises:
   forming a connection bump on the first metal layer or on the second metal layer;
   forming the insulation layer on the first metal layer or on the second metal layer; and
   laminating the first metal layer and the second metal layer, such that the chip pad is thermally coupled to the heat dissipation block via the connection bump, and the insulation layer is distributed between the bonding pads and the terminal pads.

4. The manufacturing method as recited in claim 1, wherein the step of providing the substrate comprises:
   laminating the first metal layer, the insulation layer, and the second metal layer, such that the insulation layer is distributed between the chip pad and the heat dissipation block and between the bonding pads and the terminal pads.

5. The manufacturing method as recited in claim 4, further comprising:
   forming a plurality of thermal vias, the thermal vias penetrating the chip pad and the insulation layer and being connected to the heat dissipation block, so as to thermally couple the chip pad to the heat dissipation block.

6. The manufacturing method as recited in claim 1, wherein a size of the heat dissipation block is not smaller than a size of the chip pad.

7. The manufacturing method structure as recited in claim 1, wherein a minimum horizontal distance from each of the bonding pads to one side of the chip is smaller than a minimum horizontal distance from each of the corresponding terminal pad to an orthogonal projection of the side of the chip on the heat dissipation block.

* * * * *